United States Patent [19]

Sugino et al.

[11] Patent Number: 5,225,355
[45] Date of Patent: Jul. 6, 1993

[54] GETTERING TREATMENT PROCESS

[75] Inventors: Rinshi Sugino, Atsugi; Yasuo Nara, Zama; Takashi Ito, Kawasaki, all of Japan

[73] Assignee: Fujitsu Limited, Kawasaki, Japan

[21] Appl. No.: 852,506

[22] Filed: Mar. 17, 1992

Related U.S. Application Data

[63] Continuation of Ser. No. 562,411, Aug. 1, 1990, abandoned, which is a continuation of Ser. No. 310,287, Feb. 14, 1989, abandoned.

[30] Foreign Application Priority Data

Feb. 26, 1988 [JP] Japan .................. 63-041895

[51] Int. Cl.⁵ .............. H01L 21/00; H01L 21/02; H01L 21/30; H01L 21/306
[52] U.S. Cl. ................. 437/10; 437/11; 437/13; 148/DIG. 60
[58] Field of Search .............. 437/10, 11, 13; 148/DIG. 60, DIG. 118

[56] References Cited

U.S. PATENT DOCUMENTS

| | | | |
|---|---|---|---|
| 3,933,530 | 1/1976 | Mueller et al. | 437/11 |
| 4,109,030 | 8/1978 | Briska et al. | 437/244 |
| 4,268,538 | 5/1981 | Toole et al. | 437/239 |
| 4,735,916 | 4/1988 | Homma et al. | 437/57 |
| 4,810,673 | 3/1989 | Freeman | 437/235 |

FOREIGN PATENT DOCUMENTS

| | | |
|---|---|---|
| 0246802 | 11/1987 | European Pat. Off. . |
| 0227839 | 7/1989 | European Pat. Off. . |
| 0040026 | 2/1986 | Japan . |
| 0015823 | 1/1987 | Japan . |
| 0136827 | 6/1987 | Japan . |

OTHER PUBLICATIONS

Romen, Hydrogen, Chloride and Chlorine Gettering, J. Electrochem. Soc., vol. 119, No. 3, 1972, pp. 747–752.
Sze, VLSI Technology, p. 472, 1983, McGraw-Hill.
Solid State Technology, vol. 22, No. 8, Aug. 1979, pp. 113–119; J. Monkowski: "Role of chlorine in silicon oxidation."
Japanese Journal of Applied Physics, Supplements 16th Int. Conf. Solid State Devices and Materials, Kobe, 30th Aug.–1st Sep. 1984, pp. 50–51, Tokyo, JP; K. Horioka et al.: "XeCl excimer laser oxidation of Si employing O2/Cl2 gas mixture."
Solid State Technology, vol. 25, No. 7, Jul. 1982, pp. 83–86, Port Washington, New York, U.S.; T. Hattori: "Chlorine oxidation and annealing in the fabrication of high performance LSI devices."

*Primary Examiner*—Brian E. Hearn
*Assistant Examiner*—B. Everhart
*Attorney, Agent, or Firm*—Staas & Halsey

[57] ABSTRACT

A gettering treatment process comprises the step of irradiating an ultraviolet light onto an insulating layer (a silicon oxide thin layer formed by thermally oxidizing silicon), in a chlorine-containing gas atmosphere. The ultraviolet light excites and dissociates the chlorine-containing gas thereby to generate chlorine radicals which uniformly penetrate the insulating layer, and serve to trap metal impurities within the silicon oxide thin layer.

26 Claims, 4 Drawing Sheets

GETTERING TREATMENT PROCESS

This application is a continuation of application Ser. No. 07/562,411, filed Aug. 1, 1990, now abandoned, which is a continuation of application Ser. No. 07/310,287, filed Feb. 14, 1989, now abandoned.

BACKGROUND OF THE INVENTION

Field of the Invention

The present invention relates to a gettering treatment process for an insulating layer (e.g., a silicon oxide thin layer) of a semiconductor device, and more particularly, to a gettering process for removing harmful impurities, such as mobile ions and heavy metals, by trapping (capturing) these impurities in a silicon oxide layer (e.g., gate oxide layer) formed by thermally oxidizing silicon (e.g., a silicon substrate).

Description of the Related Art

In the production of large-scale integration (LSI) devices comprising metal-oxide-semiconductor field-effect transistors (MOSFETs), e.g., dynamic random access memory (RAM) devices, a gate oxide layer is formed by thermally oxidizing a silicon substrate, and a gate electrode of polycrystalline silicon or aluminum is formed on the oxide layer. Before the formation of the gate electrode, a step of etching of the oxide layer and an ion implantation are usually carried out, whereby resist layers are deposited on the oxide layer, exposed, developed, and removed. As a result, mobile ions, such as sodium, potassium and lithium, and heavy metals, such as iron, nickel, and chromium are able to easily penetrate the oxide layer from the resist layers, an etchant, a washing water, aluminum, polycrystalline silicon, and the inside surfaces of pipes through which gas is passed. The oxide layer containing such ions and metals imposes restrictions on the design of semiconductor devices and affects the ideal characteristics of the MOS devices.

An HCl oxidation process has been adopted for trapping and neutralizing the mobile ions in the gate oxide layer. In this HCl oxidation process, a small amount of hydrogen halide (mainly hydrogen chloride: HCl) is added to the oxygen during a thermal oxidation of a silicon substrate(for example, see R.J. Kriegler et al, "The Effect of HCl and $Cl_2$ on the Thermal Oxidation of Silicon", J. Electrochem. Soc. Vol. 119, No. 3 (1972), pp. 388-392, and R.S. Romen and P.H. Rubinson, "Hydrogen Chloride and Chlorine Gettering:", ibid., pp. 747-752).

In a conventional HCl oxidation process, chlorine exists at the interface of the silicon substrate and the oxide ($SiO_2$) layer and traps and settles mobile ions (e.g., Na) which have moved to the interface, as NaCl. However, heavy metals (Fe, Ni, Cr), which do not move in the oxide layer, behave in a different manner to that of the mobile ions, and affect the characteristics of MOS devices. Namely, the HCl oxidation process has no substantial effect on the heavy metals in the oxide layer and contaminants (i.e., the above-mentioned metal impurities) penetrating the oxide layer from the surface thereof after the formation of the oxide layer.

In the case of a stacked capacitor of a dynamic RAM cell, a polycrystalline silicon layer is thermally oxidized to form an oxide ($SiO_2$) layer as an insulating (dielectric) layer of the capacitor, and due to recent demands to make the oxide layer thinner and to increase the reliability thereof, the harmful metal impurities in the oxide layer must be trapped or removed.

SUMMARY OF THE INVENTION

An object of the present invention is to provide a gettering treatment process for trapping the harmful metal impurities (mobile ions and heavy metals) present in an insulating layer (particularly, a silicon oxide layer formed by thermally oxidizing the silicon) and which penetrate therein after the formation thereof, to eliminate the harmful effects of the metal impurities.

Another object of the present invention is to improve and increase the characteristics and reliability of a gate oxide layer of a MOS device or a dielectric oxide layer of a stacked capacitor of a dynamic RAM device.

The above-mentioned and other objects of the present invention are obtained by providing a gettering treatment process comprising the step of irradiating an insulating layer, e.g., a silicon oxide thin layer formed by thermally oxidizing silicon, in a chlorine-containing gas atmosphere, with an ultraviolet light to generate chlorine radicals which penetrate uniformly the silicon layer and trap metal impurities in the layer.

Preferably, the insulating layer (silicon oxide thin layer or silicon nitride thin layer) is heated to a temperature of from 100° to 400° C., as the penetration of chlorine radicals is promoted by such heating.

BRIEF DESCRIPTION OF THE DRAWINGS

The present invention will become more apparent from the description of the preferred embodiments set forth below with reference to the accompanying drawings, in which.

DESCRIPTION OF THE PREFERRED EMBODIMENTS

Figure 1:
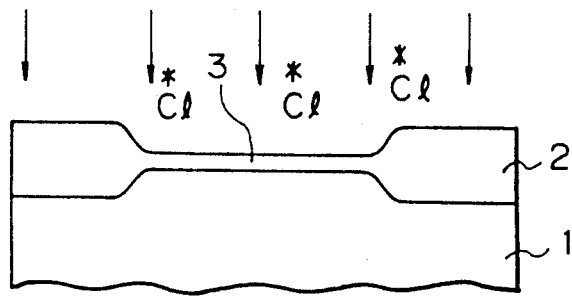
FIG. 1 is a schematic sectional and partial view of an incomplete MOS device.

Referring to FIG. 1, the incomplete MOS device comprises a silicon substrate 1, a field (thick) oxide layer 2, and a gate (thin) oxide layer 3. In the processing thereof, the silicon substrate 1 is first cleaned to remove contaminants from the surface thereof, by a conventional cleaning treatment, and then the field oxide layer 2 is formed by locally (selectively) oxidizing the silicon substrate 1 in a conventional manner using a mask to prevent oxidation. Subsequently, the mask is removed and the surface of the substrate 1 exposed thereby is cleaned. The silicon substrate 1 is then heated in an oxygen atmosphere, to oxidize the exposed silicon, whereby the gate oxide layer 3 (having a thickness of, e.g., from 2 to 100 nm) is formed, as shown in FIG. 1. Instead of the silicon oxide thin layer, it is possible to form a silicon nitride thin layer by thermally nitriding the exposed surface of the silicon substrate in a nitrogen-containing atmosphere.

Figure 3:
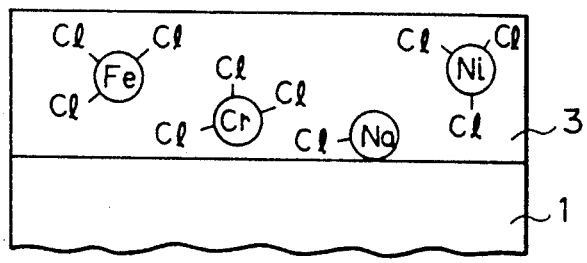
FIG. 3 is a schematic enlarged sectional view of the silicon oxide layer subjected to the gettering treatment.
Figure 2:
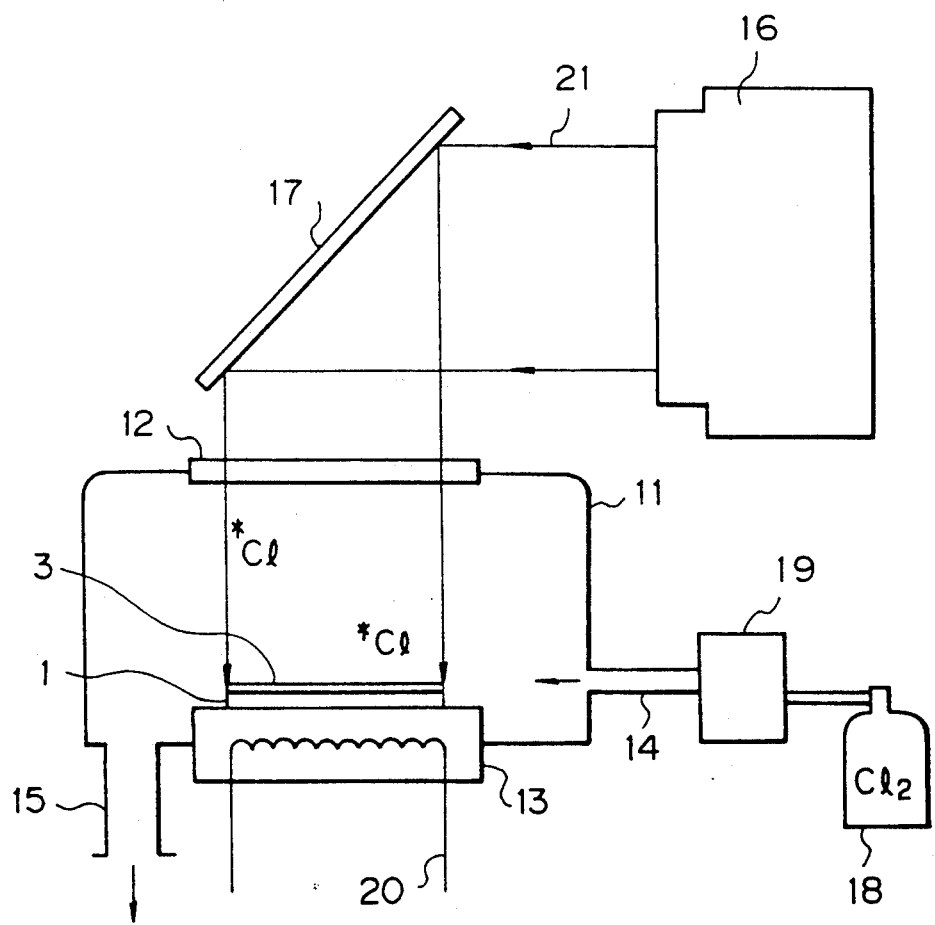
FIG. 2 is a schematic view of an apparatus for performing a gettering treatment in accordance with the present invention.

The substrate 1 with the oxide layers 2 and 3 is set in an apparatus shown in FIG. 2 for gettering treatment. The apparatus comprises a reaction chamber 11 having a transparent window 12 of quartz, a holder 13 of ceramic, an inlet pipe 14, and an outlet pipe 15, an ultraviolet light source 16 of a mercury lamp or an eximer laser (e.g., Ar - F eximer laser, and Xe-Cl eximer laser), a mirror 17, a chlorine gas source 18, and a flowmeter 19. The holder 13 is provided with a heater 20. Instead of the holder 13, a transparent holder may be used and an infrared heating element arranged thereunder. The silicon substrate 1 with the oxide layers 2 and 3 (illustrated in FIG. 2 solely for the gate oxide layer 3) is put on the holder 13 and heated to a temperature of from 100° to 400° C., and simultaneously, a high-purity chlorine ($Cl_2$) gas or a hydrogen chloride (HCl) gas is fed from the gas source 18 through the flowmeter 19 and the inlet pipe 14 into the reaction chamber 11. The gas flows out of the reaction chamber 11 through the outlet pipe 15. Under the above conditions, an ultraviolet light 21 having a wavelength of from 200 to 300 nm is emitted from the light source 16 and is reflected by the mirror 17 onto the oxide layer 2, through the transparent window 12, at an irradiation energy of about 20 mW/cm². The ultraviolet light 21 excites and dissociates the chlorine gas, to thereby generate chlorine radicals (indicated by *Cl in FIG. 1) in the reaction chamber 11. The generated chlorine radicals uniformly penetrate the oxide layer 3 and trap (bond) the mobile ions (e.g., Na) and heavy metals (e.g., Fe, Ni, and Cr), as shown in FIG. 3, within the oxide layer 3, and thus the chlorine additives immobilize the harmful ions and metals, i.e., neutralize the mobile ions, which reduces the effectiveness of the heavy metals as generation-recombination centers for carriers. Therefore, the gettering treatment according to the present invention raises the breakdown voltage of an oxide layer and prolongs a minority carrier generation life time at the interface of the oxide layer 3 and the silicon substrate 1.

Thereafter, a gate electrode (not shown) of polycrystalline silicon or aluminum is formed on the oxide layer 3 by a conventional process. It is possible to additionally form another insulating thin layer (not shown) of silicon nitride or tantalum oxide prior to the formation of the gate electrode.

Figure 4:
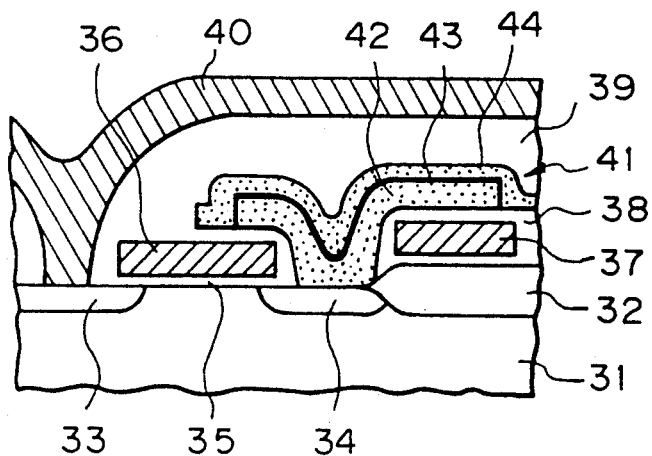
FIG. 4 is a schematic sectional and partial view of a stacked capacitor of a dynamic RAM cell.

The above-described gettering treatment can be applied to an insulating (oxide) layer of a stack capacitor of a dynamic RAM cell shown in FIG. 4. In this case, the RAM cell comprises a silicon substrate 31, a field oxide layer 32, impurity-doped regions 33 and 34, a gate oxide layer 35, a polycrystalline silicon gate 36, a polycrystalline silicon layer 37, insulating layers 38 and 39, another polycrystalline silicon layer 40, and a stacked capacitor 41. The capacitor 41 consists of a lower polycrystalline silicon electrode 42 connected to the region 34, an insulating layer 43 formed on the electrode 42 by thermal oxidation, and an upper polycrystalline silicon electrode 44. After the formation of the insulating oxide layer 43, the RAM cell is placed in the above-described apparatus, subjected to the gettering treatment using the chlorine gas and ultraviolet light, and the electrode 44 then formed over the insulating oxide layer 43.

EXAMPLE

MOS diodes were produced on a p-type (100) oriented silicon substrate in the following manner. The substrate was cleaned by a conventional cleaning procedure, and oxidized in a dry oxygen atmosphere at an $O_2$ flow rate of 6 l/min, at 1000° C., for 15 minutes, to obtain an oxide ($SiO_2$) layer having a thickness of 20 nm. The substrate with the oxide layer was placed in the apparatus shown in FIG. 2, and subjected to the gettering treatment under the following conditions.

Heating temperature: 350° C. (by an infrared heating lamp)
Chlorine gas flow rate: 50 sccm
Ultraviolet light: High pressure mercury lamp
Irradiation time: 2 minutes
Irradiation energy: 20 mW/cm² at the oxide layer Next, an aluminum layer having a thickness of 600 nm was deposited on the oxide layer by a vacuum evaporation process, and was patterned to form gate electrodes by a photolithographic process. The obtained MOS diodes were subjected to a breakdown test and a minority carrier generating life time test, and analyzed by an SIMS, and the results shown in FIGS. 5 and 7 were obtained. As comparative examples, MOS diodes were produced by the above-mentioned procedure, except that the gettering treatment was omitted, and were tested and analyzed. The results are shown in FIGS. 6 and 8.

Figure 5:
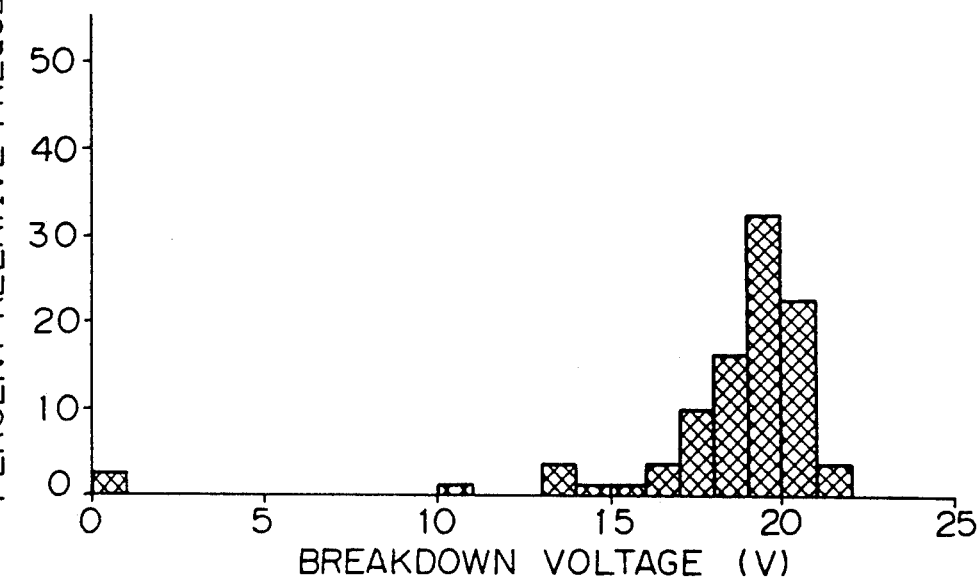
FIG. 5 is a graph showing a distribution of breakdown voltages of metal-oxide-silicon (MOS diodes subjected to the gettering treatment.
Figure 6:
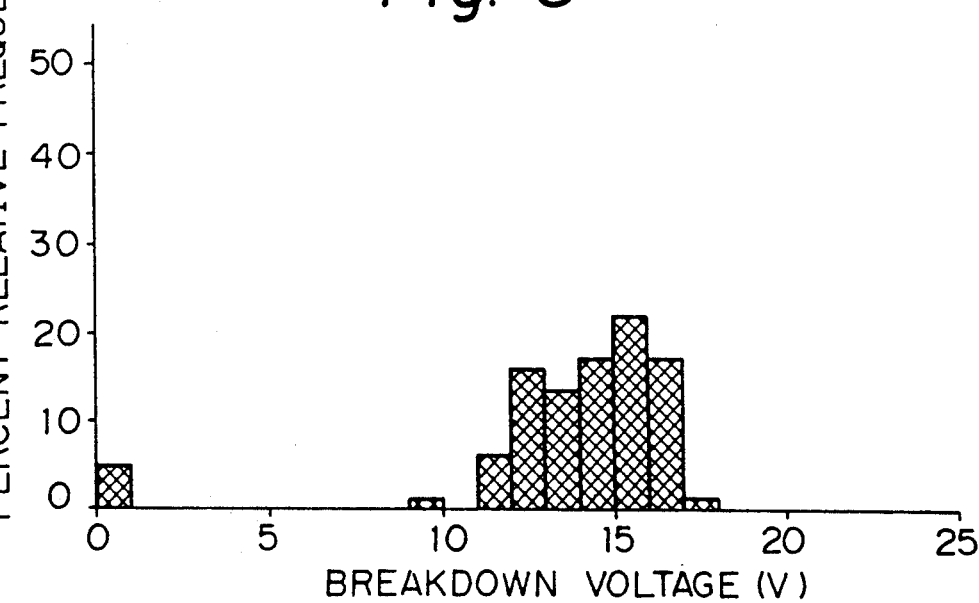
FIG. 6 is a graph showing a distribution of breakdown voltages of MOS diodes not subjected to the gettering treatment.
Figure 7:
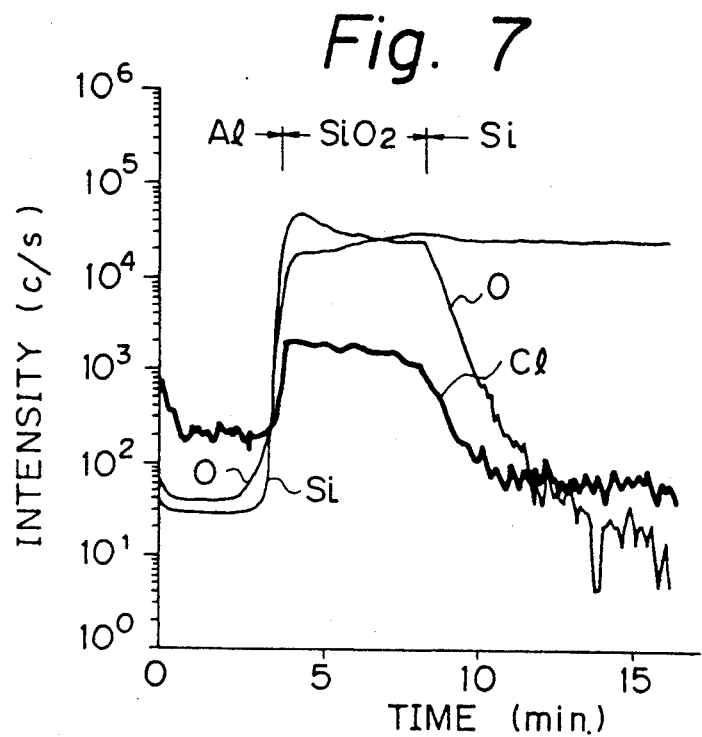
FIG. 7 is an SIMS (secondary ion mass spectrometer) chart of a MOS diode subjected to the gettering treatment.
Figure 8:
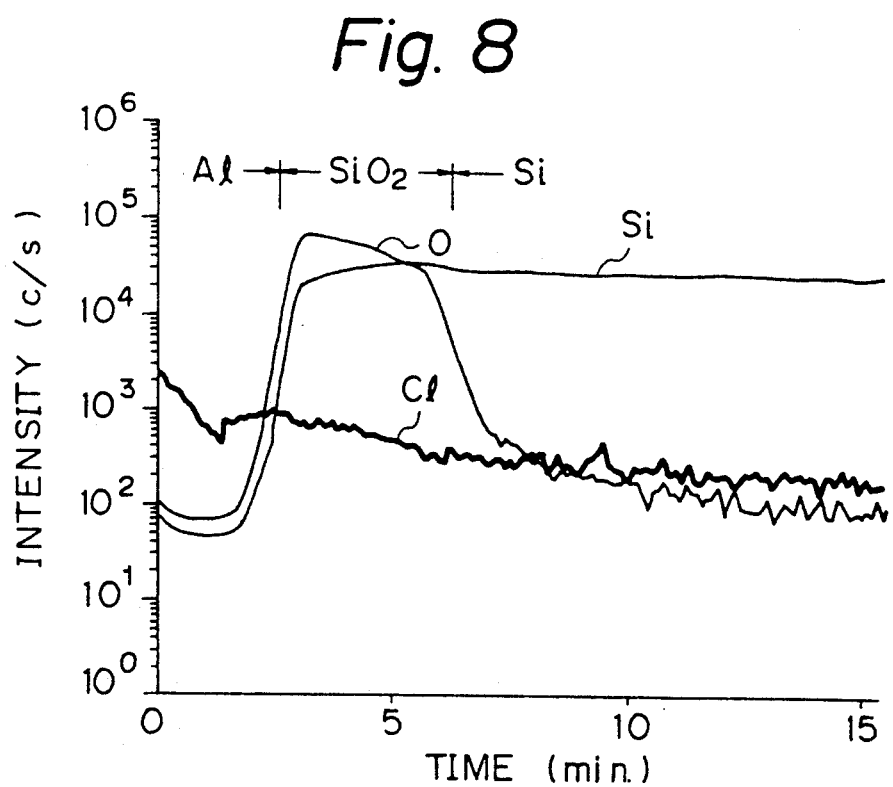
FIG. 8 is an SIMS chart of a MOS diode not subjected to the gettering treatment.

As is clear from FIGS. 5 and 7, the average breakdown voltage of the MOS diodes subjected to the gettering treatment is higher than that of the comparative MOS diodes not subjected to the gettering treatment. The minority carrier generating life time of a MOS diode subjected to the gettering treatment is 1.8 ms, which is longer than the 0.75 ms of a comparative MOS diode, and therefore, the time for which a charge can be held in a RAM cell is prolonged by the gettering treatment. The SIMS analysis was carried out by using xenon (Xe), and the transverse axes of FIGS. 7 and 8 indicate sputtering time (min) and the ordinate axes indicate the intensities of Cl, O, and Si (counts per second). As is clear from FIG. 7, chlorine is uniformly contained in the oxide layer subjected to the gettering treatment, at a convex portion of the Cl profile, but the Cl profile of FIG. 8 of the comparative MOS diode does not have a convex portion.

It will be obvious that the present invention is not restricted to the above-mentioned embodiments and that many variations are possible for persons skilled in the art without departing from the scope of the invention.

We claim:

1. A process of a succession of steps for fabricating a MOSFET semiconductor device, having a gate structure comprising a gate oxide layer of a desired thickness and a conductive layer formed in succession on a semiconductor substrate, the process comprising:

forming the gate oxide layer, of the gate structure of the MOSFET, in the desired thickness on the semiconductor substrate;

disposing the substrate with the gate oxide layer formed thereon in a chlorine-containing gas atmosphere;

irradiating the gate oxide layer, while disposed in the chlorine-containing gas atmosphere, with an ultraviolet light to generate chlorine radicals from the gas atmosphere, which chlorine radicals uniformly penetrate into and accordingly are uniformly contained within the gate oxide layer and thereby trap metal impurities within the gate oxide layer, the metal impurities comprising either or both mobile ions and relatively immobile heavy metals which, variously, are present in the gate oxide layer and penetrate into the gate oxide layer, variously, from the surface thereof and from the substrate after the irradiating step; and forming the conductive layer of the gate structure directly on the gate oxide layer, the chlorine radicals being uniformly contained therewithin, and without any step of increasing the thickness of the gate oxide layer to greater than the desired thickness of the gate oxide layer as formed on the semiconductor substrate.

2. A process according to claim 1, wherein said chlorine-containing gas is chlorine gas or hydrogen chloride gas.

3. A process according to claim 1, wherein said gate oxide layer is a silicon oxide thin layer.

4. A process according to claim 3, wherein said substrate is made of silicon and said gate oxide layer is formed by thermally oxidizing a surface of said silicon substrate.

5. A process according to claim 4, wherein said gate oxide layer has a thickness of 2 to 100 nm.

6. A process according to claim 1, wherein said gate oxide layer is heated to a temperature of from 100° C. to 400° C. by said ultraviolet light irradiation.

7. A process according to claim 6, wherein said ultraviolet light is irradiated from a mercury lamp or an eximer laser.

8. A process of a succession of steps for fabricating a dynamic RAM cell semiconductor device, having a capacitor structure comprising a lower electrode layer, a dielectric oxide layer of a desired thickness and an upper electrode layer formed in succession on a semiconductor substrate, the process comprising:

forming the capacitor lower electrode layer on the semiconductor substrate;

forming the dielectric oxide layer, of the dynamic RAM cell semiconductor device, in the desired thickness on the capacitor lower electrode layer;

disposing the substrate with the dielectric oxide layer formed on the lower electrode layer, and thereby in turn on the substrate, in a chlorine-containing gas atmosphere;

irradiating the dielectric oxide layer, while disposed in the chlorine-containing gas atmosphere, with an ultraviolet light to generate chlorine radicals from the gas atmosphere, which chlorine radicals uniformly penetrate into and accordingly are uniformly contained within the dielectric oxide layer and thereby trap metal impurities within the dielectric oxide layer, the metal impurities comprising either or both mobile ions and relatively immobile heavy metals which, variously, are present in the dielectric oxide layer and penetrate into the dielectric oxide layer, variously, from the surface thereof and from the substrate and the capacitor lower electrode layer after the ultraviolet light irradiating step; and forming the capacitor upper electrode layer directly on the dielectric oxide layer, the chlorine radicals being uniformly contained therewithin, and without any step of increasing the thickness of the dielectric oxide layer to greater than the desired thickness of the dielectric oxide layer as formed on the capacitor lower electrode layer.

9. A process according to claim 8, wherein said chlorine-containing gas is chlorine gas or hydrogen chloride gas.

10. A process according to claim 8, wherein said dielectric oxide layer is a silicon oxide thin layer.

11. A process according to claim 10, wherein said substrate is formed of silicon and said silicon oxide thin layer is formed by thermally oxidizing a surface of said silicon substrate.

12. A process according to claim 11, wherein said silicon oxide thin layer has a thickness of from 2 to 100 nm.

13. A process according to claim 8, wherein said dielectric oxide layer is heated to a temperature of from 100° C. to 400° C. by said ultraviolet irradiation.

14. A process according to claim 13, wherein said ultraviolet light is irradiated from a mercury lamp or an eximer laser.

15. A process of a succession of steps for fabricating a MOSFET semiconductor device, having a gate structure comprising a gate oxide layer of a thickness selected in accordance with the desired characteristics of the MOS semiconductor device and a conductive layer formed in succession on a main surface of the semiconductor substrate, the process comprising:

forming the gate oxide layer, of the gate structure of the MOSFET, in the desired thickness on the main surface of the semiconductor substrate, the gate oxide layer having an exposed main surface displaced from the main surface of the semiconductor substrate by the selected thickness of the gate oxide layer;

disposing the substrate with the gate oxide layer, as formed in the selected thickness on the main surface of the substrate, in a chlorine-containing gas atmosphere;

irradiating the gate oxide layer, while disposed in the chlorine-containing gas atmosphere, with an ultraviolet light to generate chlorine radicals from the gas atmosphere, which chlorine radicals uniformly penetrate into and accordingly are uniformly contained within the gate oxide layer and thereby trap metal impurities within the gate oxide layer, the metal impurities comprising either or both mobile ions and relatively immobile heavy metals which, variously, are present in the gate oxide layer and penetrate into the gate oxide layer, variously, from the surface thereof and from the substrate after the ultraviolet light irradiating step; and forming the conductive layer of the gate structure directly on the exposed main surface of the gate oxide layer of the selected thickness and having the chlorine radicals uniformly contained therewithin, and without altering the selected thickness of the gate oxide layer.

16. A process as recited in claim 15, wherein the selected thickness of the gate oxide layer is in the range of from 2 nm to 100 nm.

17. A process as recited in claim 16, wherein the selected thickness of the gate oxide layer is approximately 20 nm.

18. A process of a succession of steps for fabricating a dynamic RAM cell semiconductor device, having a capacitor structure comprising a lower electrode layer, a dielectric oxide layer of a thickness selected in accordance with the desired characteristics of the dynamic RAM cell semiconductor device and an upper electrode layer formed in succession on a main surface of a semiconductor substrate, the process comprising:

forming the capacitor lower electrode layer on the main surface of the semiconductor substrate, the capacitor lower electrode layer having an exposed, first main surface;

forming the dielectric oxide layer, of the capacitor structure of the dynamic RAM cell semiconductor device, in the selected thickness and on the exposed, first main surface of the capacitor lower electrode layer, the dielectric oxide layer having an exposed main surface displaced from the first main surface of the capacitor lower electrode layer by the selected thickness of the dielectric oxide layer;

disposing the substrate with the dielectric oxide layer, as formed in the selected thickness on the first main surface of the lower electrode layer in turn formed on the main surface of the substrate, in a chlorine-containing gas atmosphere;

irradiating the dielectric oxide layer, while disposed in the chlorine-containing gas atmosphere, with an ultraviolet light to generate chlorine radicals from the gas atmosphere, which chlorine radicals uniformly penetrate into and accordingly are uniformly contained within the dielectric oxide layer and trap metal impurities within the dielectric oxide layer, the metal impurities comprising either or both mobile ions and relatively immobile heavy metals which, variously, are present in the dielectric oxide layer and penetrate into the dielectric oxide layer, variously, from the surface thereof and from the substrate and the capacitor lower electrode layer after the ultraviolet light irradiating step; and forming the capacitor upper electrode layer directly on the exposed main surface of the dielectric oxide layer of the selected thickness and having the chlorine radicals uniformly contained therewithin, and without altering the selected thickness of the dielectric oxide layer.

19. A process as recited in claim 18, wherein the selected thickness of the dielectric oxide layer is in the range of from 2 nm to 100 nm.

20. A process as recited in claim 19, wherein the selected thickness of the dielectric oxide layer is approximately 20 nm.

21. A process of a succession of steps for fabricating a MOSFET semiconductor device, having a gate structure comprising a gate oxide layer and a conductive layer, on a semiconductor substrate, the process comprising:

forming the gate oxide layer of the gate structure of the MOSFET, the gate oxide layer being of a desired thickness;

disposing the substrate with the gate oxide layer formed thereon in a chlorine-containing gas atmosphere;

irradiating the gate oxide layer, while disposed in the chlorine-containing gas atmosphere, with an ultraviolet light to generate chlorine radicals from the gas atmosphere, which chlorine radicals penetrate into and uniformly disperse within, and thereby trap metal impurities within, the gate oxide layer, the metal impurities comprising either or both mobile ions and relatively immobile heavy metals which, variously, are present in the gate oxide layer and penetrate into the gate oxide layer variously from the surface thereof and from the substrate after the irradiating step; and forming the conductive layer of the gate structure directly on the gate oxide layer while maintaining the chlorine radicals uniformly dispersed therewithin and without increasing the desired thickness of the gate oxide layer.

22. A process as recited in claim 21, wherein the selected thickness of the gate oxide layer is in the range of from 2 nm to 100 nm.

23. A process as recited in claim 22, wherein the selected thickness of the gate oxide layer is approximately 20 nm.

24. A process of a succession of steps for fabricating a dynamic RAM cell semiconductor device, having a capacitor structure comprising a lower electrode layer, a dielectric oxide layer and an upper electrode layer, on a semiconductor substrate, the process comprising:

forming the capacitor lower electrode layer on the semiconductor substrate;

forming the dielectric oxide layer in a desired thickness on the capacitor lower electrode layer disposing the substrate with the dielectric oxide layer formed on the lower electrode layer, and thereby in turn on the substrate, in a chlorine-containing gas atmosphere;

irradiating the dielectric oxide layer, while disposed in the chlorine-containing gas atmosphere, with an ultraviolet light to generate chlorine radicals from the gas atmosphere, which chlorine radicals penetrate into and uniformly disperse within, and thereby trap metal impurities within, the dielectric oxide layer, the metal impurities comprising either or both mobile ions and relatively immobile heavy metals which, variously, are present in the dielectric oxide layer and penetrate into the dielectric oxide layer variously from the surface thereof and from the substrate and the capacitor lower electrode layer after the ultraviolet light irradiating step; and forming the capacitor upper electrode layer directly on the dielectric oxide layer while maintaining the chlorine radicals uniformly dispersed therewithin and without increasing the desired thickness of the dielectric oxide layer.

25. A process as recited in claim 24, wherein the selected thickness of the dielectric oxide layer is in the range of from 2 nm to 100 nm.

26. A process as recited in claim 25, wherein the selected thickness of the dielectric oxide layer is approximately 20 nm.

* * * * *

UNITED STATES PATENT AND TRADEMARK OFFICE
CERTIFICATE OF CORRECTION

PATENT NO. : 5,225,355
DATED : July 6, 1993
INVENTOR(S) : Rinshi SUGINO et al.

It is certified that error appears in the above-indentified patent and that said Letters Patent is hereby corrected as shown below:

Col. 1, line 29, after "implantation" insert --step--; and change "whereby" to --for which steps--;

line 45, delete "a" (first occurrence);
line 57, change "to" to --from--.

Signed and Sealed this

Twenty-third Day of August, 1994

Attest:

BRUCE LEHMAN

*Attesting Officer*     *Commissioner of Patents and Trademarks*